United States Patent

Korthuis et al.

(10) Patent No.: US 8,822,988 B2
(45) Date of Patent: Sep. 2, 2014

(54) THIN-FILM TRANSISTOR (TFT) WITH A BI-LAYER CHANNEL

(75) Inventors: Vincent C. Korthuis, Corvallis, OR (US); Randy Hoffman, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 101 days.

(21) Appl. No.: 13/255,137

(22) PCT Filed: Mar. 31, 2009

(86) PCT No.: PCT/US2009/039026
§ 371 (c)(1),
(2), (4) Date: Sep. 29, 2011

(87) PCT Pub. No.: WO2010/114529
PCT Pub. Date: Oct. 7, 2010

(65) Prior Publication Data
US 2012/0012840 A1 Jan. 19, 2012

(51) Int. Cl.
*H01L 29/786* (2006.01)

(52) U.S. Cl.
USPC .............. 257/43; 257/59; 257/E29.296

(58) Field of Classification Search
USPC ................................................ 257/43, 59
See application file for complete search history.

(56) References Cited

U.S. PATENT DOCUMENTS

| | | | |
|---|---|---|---|
| 2006/0086936 A1 | 4/2006 | Hoffman et al. | |
| 2006/0197092 A1 | 9/2006 | Hoffman et al. | |
| 2006/0199314 A1 | 9/2006 | Chen et al. | |
| 2008/0023703 A1* | 1/2008 | Hoffman et al. | 257/59 |

FOREIGN PATENT DOCUMENTS

KR    20080074515 A    8/2008

* cited by examiner

*Primary Examiner* — Thanh Nguyen

(57) ABSTRACT

In at least some embodiments, a thin-film transistor (TFT) includes a gate electrode and a gate dielectric covering the gate dielectric. The TFT also includes a source electrode and a drain electrode adjacent the gate dielectric. The TFT also includes a bi-layer channel between the source electrode and the drain electrode, the bi-layer channel having a zinc indium oxide (ZIO) layer positioned adjacent the gate dielectric and a zinc tin oxide (ZTO) layer that covers the ZIO layer.

9 Claims, 2 Drawing Sheets

THIN-FILM TRANSISTOR (TFT) WITH A BI-LAYER CHANNEL

BACKGROUND

Semiconductor devices such as thin-film transistors (TFTs) are used in a variety of electronic devices. In part, the performance (e.g., speed) of such electronic devices is a function of the performance and electrical characteristics of such transistors.

BRIEF DESCRIPTION OF THE DRAWINGS

For a detailed description of exemplary embodiments of the invention, reference will now be made to the accompanying drawings in which.

NOTATION AND NOMENCLATURE

Figure 1A:
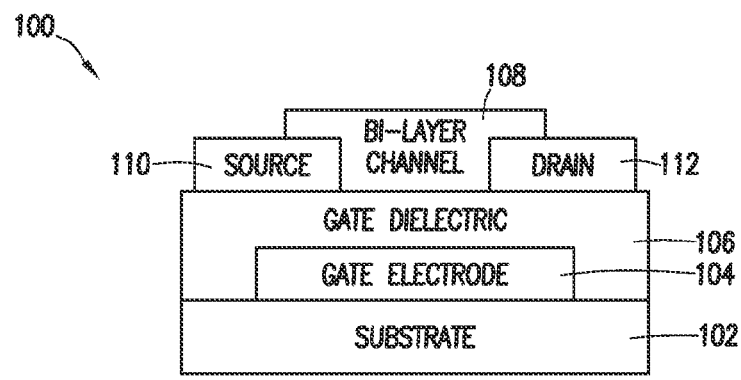
FIGS. 1A-1B illustrate semiconductor devices in accordance with embodiments of the disclosure.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The subject matter of this disclosure is directed to performance improvements of semiconductor devices such as Thin-Film Transistors (TFTs). More specifically, semiconductor device embodiments (e.g., Thin-Film Transistors (TFTs)) having a bi-layer channel and related manufacturing methods are disclosed. In at least some embodiments, a first channel layer comprises Zinc Indium Oxide ("ZIO") and a second channel layer comprises Zinc Tin Oxide ("ZTO"), where the first channel layer is positioned adjacent the TFT gate dielectric and the second channel layer covers (i.e., caps) the surface of the first channel layer opposite the gate dielectric. The ZIO and ZTO channel layers may include materials in an amorphous form, a single-phase crystalline state, or a mixed-phase crystalline state.

In accordance with embodiments, the ZIO first channel layer comprises a range of compositions, which may be quantified as the atomic ratio of zinc (Zn) to indium (In). The ZIO composition (Zn:In, atomic) may range from about 19:1 to about 1:19; more particular compositions of interest may include Zn:In atomic ratios of about 1:4 or about 1:1. It has been observed that, in certain instances, a more In-rich composition (such as the 1:4 composition) can exhibit superior electron mobility, but inferior stability, as compared to a less In-rich composition (such as the 1:1 composition). Meanwhile, the ZTO second channel layer may similarly comprise a range of compositions, including Zn:Sn atomic ratios from about 19:1 to about 1:19, and more particularly Zn:Sn ratios of about 1:1 or about 2:1. Capping the ZIO channel layer with the ZTO channel layer helps to protect the ZIO channel layer from deleterious interactions with subsequent processing (e.g., photolithographic patterning and developing, stripping, or capping with other dielectric materials) or other environmental factors that may negatively influence the electronic properties of the ZIO channel layer. In the disclosed bi-layer channel design, the overall TFT performance is primarily determined by properties of the ZIO channel layer, due to its location directly adjacent the TFT gate dielectric, with the ZTO channel layer capping the ZIO channel layer for protection.

The disclosed devices and methods were developed as a thin-film transistor (TFT) technology, including TFTs that are at least partially transparent. However, embodiments are not necessarily limited to TFTs or transparent applications. Desirable features of the disclosed bi-layer channel technology include high-mobility performance and low-temperature processing (e.g., less than around 175° Celsius). It should be understood that the various semiconductor devices may be employed in connection with the various devices. Such devices include, for example, active matrix displays, logic circuitry, and amplifiers.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

Figure 1B:
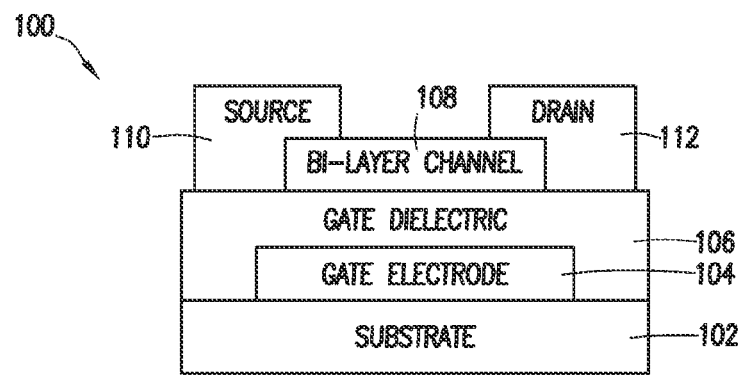

FIGS. 1A-1B illustrate semiconductor devices in accordance with embodiments of the disclosure. It should be noted that, while FIGS. 1A-1B depict bottom-gate type TFT configurations, it is possible that other TFT configurations, including but not limited to top-gate or double-gate configurations, may be conceived within the scope of this invention. More specifically, FIG. 1A depicts a bottom-gate TFT with coplanar electrodes and FIG. 1B depicts a bottom-gate TFT with staggered electrodes. As used herein, a coplanar electrode configuration is intended to mean a transistor structure where the source and drain electrodes are positioned on the same side of the channel as the gate electrode. A staggered electrode configuration is intended to mean a transistor structure where the source and drain electrodes are positioned on the opposite side of the channel as the gate electrode.

In each of FIGS. 1A-1B, the transistors 100 include a substrate 102, a gate electrode 104, a gate dielectric 106, a bi-layer channel 108, a source electrode 110, and a drain electrode 112. In each of FIGS. 1A-1B, the gate dielectric 106 is positioned between the gate electrode 104 and the source and drain electrodes 110, 112 such that the gate dielectric 106 physically separates the gate electrode 104 from the source and the drain electrodes 110, 112. Additionally, in each of the FIGS. 1A-1B, the source and the drain electrodes 110, 112 are separately positioned thereby forming a region between the source and drain electrodes 110, 112 for interposing the bi-layer channel 108. Thus, in each of FIGS. 1A-1B, the gate dielectric 106 is positioned adjacent the bi-layer channel 108, and physically separates the source and drain electrodes 110, 112 from the gate electrode 104. Additionally, in each of the FIGS. 1A-1B, the bi-layer channel 108 is positioned adjacent the gate dielectric 106 and is interposed between the source and drain electrodes 110, 112.

In each of FIGS. 1A-1B, the bi-layer channel 108 interposed between the source and the drain electrodes 110, 112 provides a controllable electric pathway between the source and drain electrodes 110, 112 such that when a voltage is applied to the gate electrode 104, an electrical charge can move between the source and drain electrodes 110, 112 via the bi-layer channel 108. The voltage applied at the gate electrode 104 can vary the ability of the bi-layer channel 108 to conduct the electrical charge and thus, the electrical properties of the bi-layer channel 108 can be controlled, at least in part, through the application of a voltage at the gate electrode 104.

Figure 2:
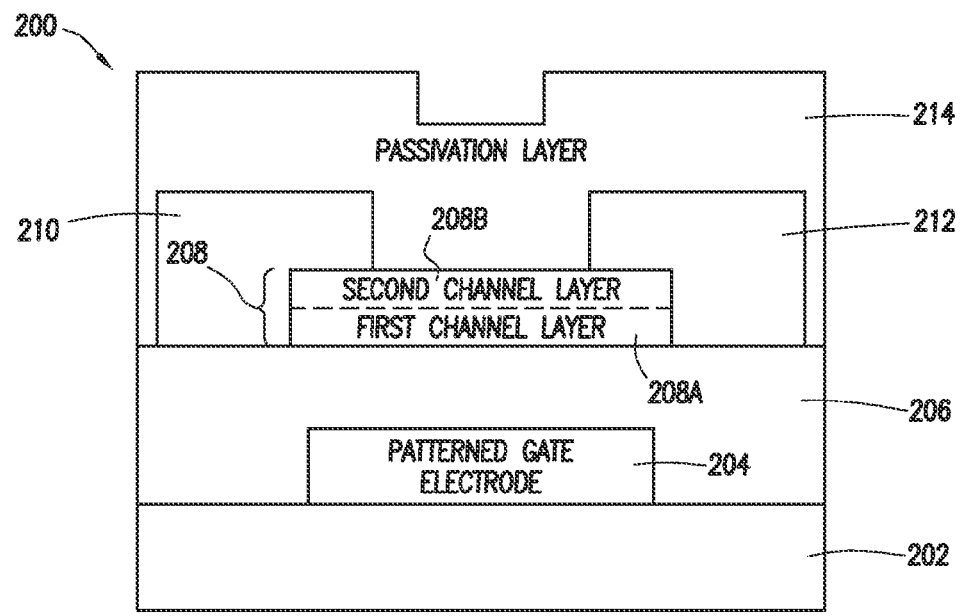
FIG. 2 illustrates a cross-sectional schematic of a thin-film transistor in accordance with an embodiment of the disclosure.

A more detailed description of an embodiment of a bi-layer thin-film transistor (TFT) is illustrated in FIG. 2, which illustrates a cross-sectional schematic of a TFT. More specifically, FIG. 2 illustrates a cross-sectional view of an exemplary bottom gate TFT 200. It will be appreciated that the different TFT layers described in FIG. 2, as well as the materials and methods used are equally applicable to any of the transistor embodiments described herein, including those described in connection with FIGS. 1A-1B.

Moreover, in the various embodiments, the TFT 200 can be included in a number of devices including an active matrix display screen device, a logic inverter, and an amplifier. The TFT 200 can also be included in an infrared device, where transparent components are also used.

As shown in FIG. 2, the TFT 200 comprises a substrate 202, a gate electrode 204 positioned adjacent the substrate 202, and a gate dielectric 206 positioned adjacent the gate electrode 204. The TFT 200 also includes a bi-layer channel 208 contacting the gate dielectric 206, a source electrode 210, and a drain electrode 212. The TFT 200 may also include a passivation layer 214 disposed over the other TFT elements. In various embodiments, the bi-layer channel 208 is positioned between and electrically couples the source electrode 210 and the drain electrode 212. As shown in FIG. 2, the bi-layer channel 208 comprises a first channel layer 208A and a second channel layer 208B.

In the embodiment of FIG. 2, the substrate 202 includes glass. Additionally or alternatively, the substrate 202 may include any suitable substrate material or composition for implementing the various embodiments. Further, the substrate 202 illustrated in FIG. 2 includes an appropriately-patterned layer of Al to form the gate electrode 204. However, any number of materials may be used for the gate electrode 204. Such materials may include transparent conductive materials such as an n-type doped $In_2O_3$, $SnO_2$, ZnO or indium-tin oxide (ITO). Other suitable materials include metals such as Mo, W, Ti, Ag, and Cu, and alloys or multi-layers thereof. In the embodiment illustrated in FIG. 2, the thickness of the gate electrode 204 is approximately 200 nm. The thickness of a gate electrode can vary depending on the materials used, TFT application, and other factors.

The gate dielectric 206 shown in FIG. 2 is unpatterned; however, outside the TFT area the gate dielectric 206 may be appropriately patterned as required for a particular implementation (e.g., to provide contact "vias" from the gate electrode 204 to the source/drain layer or another subsequent conductor layer). In the various embodiments, the gate dielectric 206 can include various layers of different materials having insulating properties representative of gate dielectrics. Such materials can include silicon oxide ($SiO_2$), silicon nitride ($SiN_x$), aluminum oxide ($Al_2O_3$), hafnium oxide ($HfO_2$), zirconium oxide ($ZrO_2$), tantalum pentoxide ($Ta_2O_5$), various organic dielectric materials, and/or other suitable materials.

The various layers of the transistor structures described herein can be formed using a variety of techniques. For example, the gate dielectric 206 may be deposited by sputter deposition from a sintered $HfO_2$ ceramic target. Examples of thin-film deposition techniques include, but are not limited to, evaporation (e.g., thermal, e-beam), sputter deposition (e.g., dc reactive sputtering, rf magnetron sputtering, ion beam sputtering), chemical vapor deposition (CVD) including plasma-enhanced CVD (PECVD), atomic layer deposition (ALD), pulsed laser deposition (PLO) and molecular beam epitaxy (MBE). Additionally, alternate methods may also be employed for depositing the various transistor layers of the embodiments of the present disclosure. Such alternate methods can include anodization (electrochemical oxidation) of a metal film, as well as deposition from a liquid precursor such as by spin coating or ink-jet printing, including thermal and piezoelectric drop-on-demand printing. Film patterning may employ photolithography combined with etching or lift-off processes, or may use alternate techniques such as shadow masking. Chemical and/or electronic doping of one or more of the layers (e.g., the bi-layer channel 208 illustrated in FIG. 2) may also be accomplished by the introduction of oxygen vacancies and/or substitution of appropriate elements such as Sn, Al, Ge, and Ga.

In the various embodiments, the source electrode 210 and the drain electrode 212 are separately positioned adjacent the gate dielectric 206 and are in direct contact with at least one of the first channel layer 208A and the second channel layer 208B. Although not required, the source and drain electrodes 210, 212 may be formed from the same materials as those discussed with regard to the gate electrode 204. In FIG. 2, the source electrode 210 and the drain electrode 212 have a thickness of about 200 nm. In the various embodiments however, the thickness can vary depending on a variety of factors including type of materials, TFT application, or other factors. In various embodiments, the electrodes 210, 212, may include a transparent conductor, such as an n-type doped wide-bandgap semiconductor. Examples include, but are not limited to, n-type doped $In_2O_3$, $SnO_2$, indium-tin oxide (ITO), or ZnO. The electrodes 210, 212 may also include a metal such as Al, Mo, Ti, Ag, Cu, Au, Pt, W, or Ni, and alloys or multi-layers thereof. In the various embodiments of the present disclosure, all of the electrodes 204, 210, and 212 may include transparent materials such that the various embodiments of the transistors may be substantially transparent.

In the various embodiments, the first channel layer 208A of bi-layer channel 208 is formed from a ternary material containing zinc, indium and oxygen to form zinc-indium oxide (ZIO) in the formulation, for example, $Zn_xIn_{2y}O_{x+3y}$. In at least some embodiments, the ZIO layer comprises an approximate 1:4 or 1:1 atomic ratio of Zn to In.

Meanwhile, the second channel layer 208B of bi-layer channel 208 is formed from a ternary material containing zinc, tin, and oxygen to form zinc-tin oxide (ZTO). ZTO formulations that have proven useful include $ZnSnO_3$, $Zn_2SnO_4$, and/or combinations thereof. It should be noted that these formulations are intended to denote composition (i.e., relative quantity of the atomic components Zn, Sn, O) rather than particular molecular or crystalline species. More generally, ZTO materials of interest herein may comprise the compositional range $(ZnO)_x(SnO_2)_{1-x}$, with x between 0.05 and 0.95. In at least some embodiments, the ZTO layer comprises an approximate 1:1 atomic ratio of zinc to tin.

While the ZIO and ZTO formulations listed above refer only to stoichiometry (i.e., the relative quantities of zinc and indium, or zinc, indium and oxygen for ZIO and the relative quantities of zinc and tin, or zinc, tin, and oxygen for ZTO), a variety of morphologies or structural configurations may be obtained depending on composition, processing conditions, and other factors. For example, the ZIO and ZTO layers may be either substantially amorphous or substantially poly-crystalline. A poly-crystalline film may furthermore contain a single crystalline phase (e.g., $Zn_2SnO_4$) or may be phase-segregated so that the channel contains multiple phases (e.g., $Zn_2SnO_4$, ZnO, and $SnO_2$). In accordance with at least some embodiments, each layer (208A and 208B) of the bi-layer channel 208 has a thickness of about 10 nm to about 100 nm. In various embodiments the thickness may vary depending on a variety of factors including whether the channel material is amorphous or polycrystalline, and the device in which the TFT 200 is to be incorporated.

In at least some embodiments, the source, drain, and gate electrodes may include a substantially transparent material. By using substantially transparent materials for the source, drain, and gate electrodes, areas of the thin-film transistor can be transparent to the portion of the electromagnetic spectrum that is visible to the human eye. In the transistor arts, a person of ordinary skill will appreciate that devices such as active matrix liquid crystal displays having display elements (pixels) coupled to TFTs having substantially transparent materials for selecting or addressing the pixel to be on or off may benefit display performance by allowing more light to be transmitted through the display.

In the embodiment of FIG. 2, the bi-layer channel 208 is positioned adjacent the gate dielectric 206 and between the source and drain electrodes 210, 212, so as to contact and electrically couple the electrodes 210 and 212. An applied voltage at the gate electrode 204 can facilitate electron accumulation in the bi-layer channel 208. In this manner, the bi-layer channel 208 can allow for on/off operation by controlling current flowing between the drain electrode 212 and the source electrode 210 using a voltage applied to the gate electrode 204. In accordance with some embodiments, the first channel layer 208A has higher electron mobility than the second channel layer 208B for the same voltage applied to the gate electrode 204. As an example, a ZIO channel may exhibit electron mobility as high as ~30 $cm^2/Vs$ and a ZTO channel may exhibit electron mobility as high as ~10 $cm^2/V$ s, depending on process conditions including but not limited to temperature. As appreciated by one skilled in the art, electron mobility is a characteristic that can help in determining TFT performance, as maximum operating frequency, speed, and drive current increase in direct proportion to channel mobility. Although the ZTO channel layer exhibits less electron mobility than the ZIO channel layer, the ZTO channel layer is less sensitive to damage during manufacture and to undesirable interactions with TFT passivation layers. Furthermore, since the electron accumulation layer in a TFT is localized adjacent the gate dielectric channel interface, channel charge transport will take place primarily in the higher-mobility (ZIO) portion of the bi-layer channel 208.

In accordance with at least some embodiments, a passivation layer 214 may be disposed over the rest of the assembled TFT structure 200 (gate 204, gate dielectric 206, bi-layer channel 208, source electrode 210, and drain electrode 212). The passivation layer 214 may provide, for example, electrical isolation from subsequent circuit layers (e.g., conductive interconnect circuitry). In other words, the passivation 214 layer may be an insulator. Additionally, the passivation layer 214 may provide chemical, environmental and/or mechanical protection to promote performance and device durability in a given application. Appropriate passivation materials include silicon oxide ($SiO_2$), silicon nitride ($SiN_x$), aluminum oxide ($Al_2O_3$), hafnium oxide ($HfO_2$), zirconium oxide ($ZrO_2$), tantalum pentoxide ($Ta_2O_5$), various organic dielectric materials, and/or other suitable materials.

The use of the bi-layer channel 208 illustrated in the embodiments of the present disclosure is beneficial for a wide variety of thin-film applications in integrated circuit structures. For example, such applications include transistors, as discussed herein, such as thin-film transistors, which may be configured in various architectures including coplanar electrode, staggered electrode, bottom-gate, and top-gate, to name only a few. In the various embodiments, transistors (e.g., TFTs) of the present disclosure can be provided as switches or amplifiers, where applied voltages to the gate electrodes of the transistors can affect a flow of electrons, from the source electrode 210 to the drain electrode 212, through the bi-layer channel 208. As one of ordinary skill will appreciate, when the transistor is used as a switch, the transistor can operate in the saturation region, and where the transistor is used as an amplifier, the transistor can operate in the linear region. In addition, transistors incorporating the bi-layer channel 208 may be incorporated into integrated circuits and structures such as visual display panels (e.g., active matrix LCD displays) as is shown and described in connection with FIG. 4 below. In display applications and other applications, it may be desirable to fabricate one or more of the components of the TFT 200 to be at least partially transparent.

Embodiments of the present disclosure also include methods of forming metallic films on a surface of a substrate or substrate assembly, such as a glass sheet, with or without layers or structures formed thereon, to form integrated circuits, and in particular TFTs as described herein. It is to be understood that methods of the present disclosure are not limited to deposition on glass. For example, other substrates such as flexible substrates including organics ("plastics"), metal foils, or combinations thereof may be used as well. Furthermore, the methods disclosed herein may be applied to non-wafer substrates such as fibers or wires. In general, the films can be formed directly on the lowest surface of the substrate, or they can be formed on any of a variety of the layers (surfaces) as in a patterned wafer, for example.

Figures 3, 4:
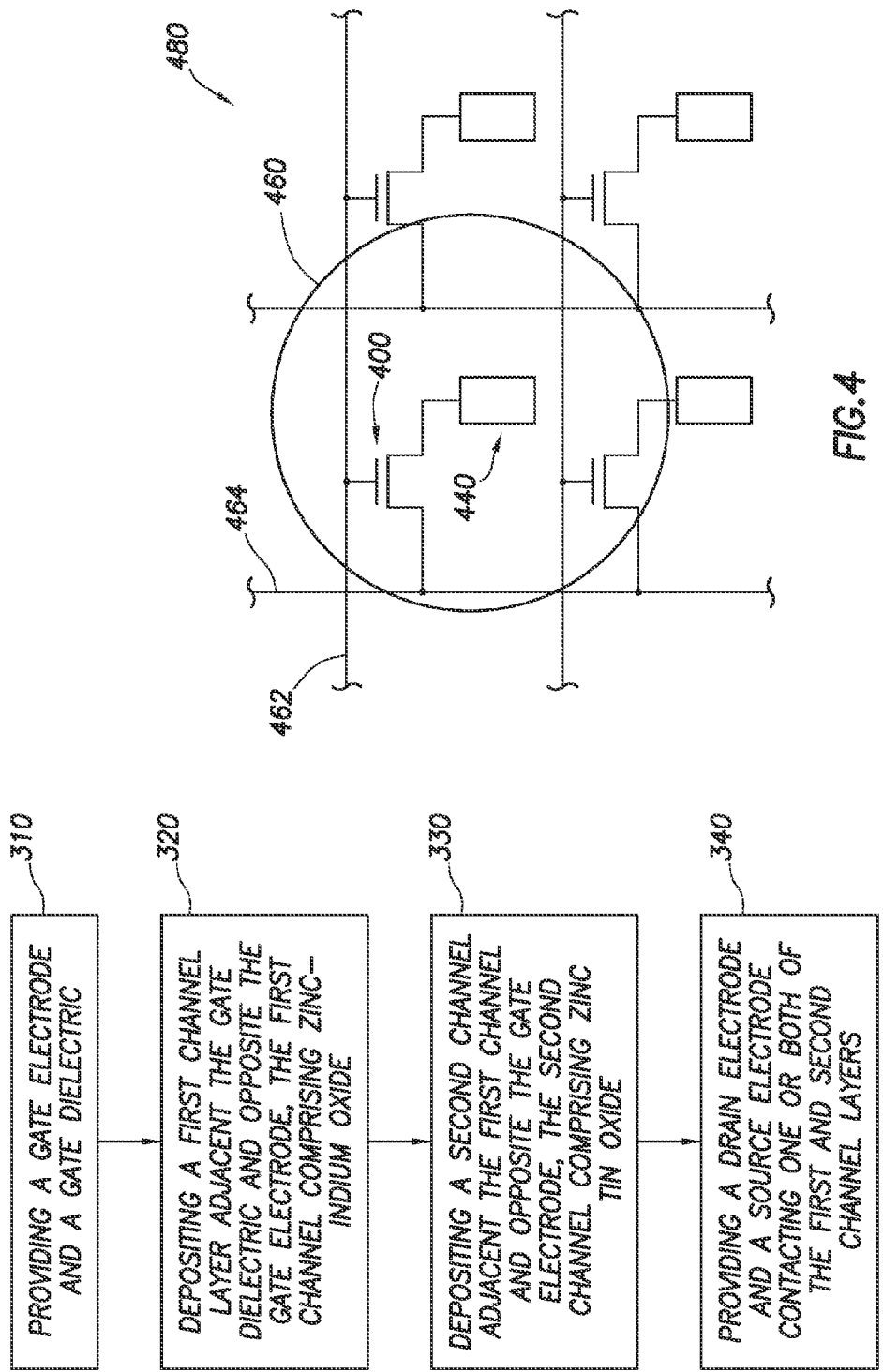
FIG. 3 illustrates a method for manufacturing a thin-film transistor in accordance with an embodiment of the disclosure.
FIG. 4 illustrates an active matrix display area in accordance with an embodiment of the disclosure.

FIG. 3 illustrates a method 300 for manufacturing a thin-film transistor in accordance with an embodiment of the disclosure. At block 310, a gate electrode and a gate dielectric are provided. For example, the gate electrode and the gate dielectric may be provided on the substrate of a substrate assembly. As used herein, the term "substrate" refers to the base substrate material layer, e.g., the lowest layer of glass material in a glass wafer. Meanwhile, the term "substrate assembly"

refers to a substrate having one or more layers or structures formed thereon. Examples of substrate types include, but are not limited to, glass, plastic, and metal, and include such physical forms as sheets, films, and coatings. In various embodiments, substrates may be opaque or substantially transparent.

At block 320, a first channel layer is deposited adjacent the gate dielectric and opposite (aligned with) the gate electrode, the first channel layer comprising ZIO. At block 330, a second channel layer is deposited adjacent the first channel layer and opposite (aligned with) the gate electrode, the second channel layer comprising ZTO. Each of the first channel layer and the second channel layer may exhibit an amorphous state, a single-phase crystalline state or a mixed-phase crystalline state. In at least some embodiments, the ZIO layer comprises an approximate 1:4 or 1:1 atomic ratio of zinc to indium. Further, the ZTO layer comprises an approximate 1:1 or 2:1 atomic ratio of zinc to tin. At block 340, a drain electrode and a source electrode are provided contacting one or both of the first and second channel layers. In accordance with embodiments, the drain electrode and source electrode are separated from the gate electrode by the date dielectric.

In accordance with at least some embodiments, depositing the first channel layer (as in block 320) and depositing the second channel layer (as in block 330) may include providing a precursor composition including one or more precursor compounds. Various combinations of the precursor compounds described herein can be used in the precursor composition. Thus, as used herein, a "precursor composition" refers to a solid or liquid that includes one or more precursor compounds of the formulas described herein optionally mixed with one or more compounds of formulas other than those described herein. As an example, for the first channel layer, zinc precursor compounds and indium precursor compounds can be provided in one precursor composition or in separate compositions. Similarly, for the second channel layer, zinc precursor compounds and tin precursor compounds can be provided in one precursor composition or in separate compositions. In alternative embodiments, one precursor compound could be envisioned to provide both metals (e.g., zinc/indium or zinc/tin). As used herein, "liquid" refers to a solution or a neat liquid (a liquid at room temperature or a solid at room temperature that melts at an elevated temperature). As used herein, a "solution" does not call for complete solubility of the solid; rather, the solution may have some undissolved material. More desirably, however, there is a sufficient amount of the material that can be carried by the organic solvent into the vapor phase for chemical vapor deposition processing. The precursor compounds can also include one or more organic solvents suitable for use in a chemical vapor deposition system, as well as other additives, such as free ligands, that assist in the vaporization of the desired compounds.

Although not required, the first channel layer may have a uniform composition of ZIO throughout its thickness. Alternatively, the concentrations of zinc of indium in the first channel layer may vary as the layer is formed. Similarly, the second channel layer may have a uniform composition or varied composition of ZTO throughout its thickness. As will be appreciated, the thickness of the first channel layer and the second channel layer will be dependent upon the application for which it is used. For example, the thickness for each channel layer may have a range of about 5 nanometers to about 300 nanometers.

The embodiments described herein may be used for fabricating chips, integrated circuits, monolithic devices, semiconductor devices, and microelectronic devices, such as display devices. For example, FIG. 4 illustrates an embodiment of a display device such as an active-matrix liquid-crystal display (AMLCD) 480. In FIG. 4, the AMLCD 480 can include pixel devices (i.e., liquid crystal elements) 440 in a matrix of a display area 460. The pixel devices 440 in the matrix can be coupled to thin-film transistors 400 also located in the display area 460. The thin-film transistor 400 can include embodiments of the thin-film transistors with a bi-layer ZIO/ZTO channel as disclosed herein. Additionally, the AMLCD 480 can include orthogonal control lines 462 and 464 for supplying an addressable signal voltage to the thin-film transistors 400 to influence the thin-film transistors to turn on and off and control the pixel devices 440 (e.g., to provide an image on the AMLCD 480). While this specific example has described an active matrix LCD display, the TFT devices described here may alternately be used to form an active matrix backplane suitable to drive any of a number of active matrix display types, including organic light-emitting diodes (OLEDs) and electrophoretic (EP) type devices.

Although specific exemplary embodiments have been illustrated and described herein, those of ordinary skill in the art will appreciate that an arrangement calculated to achieve the same techniques can be substituted for the specific exemplary embodiments shown. This disclosure is intended to cover adaptations or variations of the embodiments of the invention. It is to be understood that the above description has been made in an illustrative fashion, and not a restrictive one.

In the foregoing Detailed Description, various features are grouped together in a single exemplary embodiment for the purpose of streamlining the disclosure. This method of disclosure is not to be interpreted as reflecting an intention that the embodiments of the invention necessitate more features than are expressly recited in each claim. Rather, as the following claims reflect, inventive subject matter lies in less than all features of a single disclosed exemplary embodiment. Thus, the following claims are hereby incorporated into the Detailed Description, with each claim standing on its own as a separate embodiment.

What is claimed is:

1. A thin-film transistor (TFT), comprising:
   a gate electrode;
   a gate dielectric covering the gate electrode;
   a source electrode and a drain electrode adjacent the gate dielectric; and
   a bi-layer channel between the source electrode and the drain electrode, the bi-layer channel having a zinc indium oxide (ZIO) layer positioned adjacent the gate dielectric and a zinc tin oxide (ZTO) layer that covers the ZIO layer.

2. The TFT of claim 1 wherein the ZIO layer comprises an approximate 1:4 atomic ratio of zinc to indium.

3. The TFT of claim 1 wherein the ZIO layer comprises an approximate 1:1 atomic ratio of zinc to indium.

4. The TFT according to any of the above claims, wherein the ZTO layer comprises an approximate 1:1 atomic ratio of zinc to tin.

5. The TFT according to any of the above claims, further comprising a passivation layer covering the ZTO layer.

6. The TFT of claim 5 wherein the passivation layer comprises silicon oxide, silicon nitride, silicon oxynitride, or hafnium oxide.

7. An active-matrix display, comprising:
   a plurality of thin-film transistors (TFTs), each of said TFTs comprises a gate dielectric and a bi-layer channel having a zinc indium oxide (ZIO) layer positioned adjacent the gate dielectric and a zinc tin oxide (ZTO) layer that covers the ZIO layer.

8. The active-matrix display of claim 7 wherein the ZIO layer comprises an approximate 1:4 or 1:1 atomic ratio of zinc to indium and wherein the ZTO layer comprises an approximate 1:1 atomic ratio of zinc to tin.

9. The active-matrix display according to any of the above claims, wherein the plurality of TFTs are covered by a passivation layer of silicon oxide, silicon nitride, silicon oxynitride, hafnium oxide, or a combination thereof.

\* \* \* \* \*